(12) United States Patent
Fussell et al.

(10) Patent No.: US 7,302,364 B2
(45) Date of Patent: Nov. 27, 2007

(54) METHODS AND SYSTEMS FOR ADVANCED SPACEPORT INFORMATION MANAGEMENT

(75) Inventors: Ronald M. Fussell, Cocoa, FL (US); Donald W. Ely, Titusville, FL (US); Gary M. Meier, Rockledge, FL (US); Paul C. Halpin, Orlando, FL (US); Phillip T. Meade, Merritt Island, FL (US); Craig A. Jacobson, Cocoa, FL (US); Charlie Blackwell-Thompson, Merritt Island, FL (US)

(73) Assignees: The Boeing Company, Chicago, IL (US); The United States of America as Represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 11/083,420

(22) Filed: Mar. 17, 2005

(65) Prior Publication Data

US 2006/0038084 A1 Feb. 23, 2006

Related U.S. Application Data

(60) Provisional application No. 60/593,014, filed on Jul. 30, 2004.

(51) Int. Cl.
*B04G 1/00* (2006.01)
(52) U.S. Cl. ...................................... 702/188
(58) Field of Classification Search ................ 702/188, 702/33, 35, 36; 701/3, 2, 29, 30, 31
See application file for complete search history.

(56) References Cited

U.S. PATENT DOCUMENTS

| 4,466,063 | A | 8/1984 | Segarra et al. |
|---|---|---|---|
| 5,152,482 | A | 10/1992 | Perkins et al. |
| 5,314,146 | A | 5/1994 | Chicoine et al. |
| 5,317,689 | A | 5/1994 | Nack et al. |
| 5,355,238 | A | 10/1994 | Kight et al. |
| 5,474,262 | A | 12/1995 | Fiore |
| 5,518,209 | A | 5/1996 | Chicoine et al. |
| 5,623,357 | A | 4/1997 | Kight et al. |
| 5,624,088 | A | 4/1997 | Fiore |
| 5,755,406 | A | 5/1998 | Aston et al. |
| 5,801,938 | A | 9/1998 | Kalantery |

(Continued)

OTHER PUBLICATIONS http://www.m-w.com/dictionary/emulate, p. 1.*

*Primary Examiner*—Tung S. Lau
(74) *Attorney, Agent, or Firm*—Lee & Hayes, PLLC

(57) ABSTRACT

Advanced spaceport information management methods and systems are disclosed. In one embodiment, a method includes coupling a test system to the payload and transmitting one or more test signals that emulate an anticipated condition from the test system to the payload. One or more responsive signals are received from the payload into the test system and are analyzed to determine whether one or more of the responsive signals comprises an anomalous signal. At least one of the steps of transmitting, receiving, analyzing and determining includes transmitting at least one of the test signals and the responsive signals via a communications link from a payload processing facility to a remotely located facility. In one particular embodiment, the communications link is an Internet link from a payload processing facility to a remotely located facility (e.g. a launch facility, university, etc.).

12 Claims, 6 Drawing Sheets

U.S. PATENT DOCUMENTS

| | | |
|---|---|---|
| 5,812,528 A | 9/1998 | VanDervort |
| 5,961,076 A | 10/1999 | Eller et al. |
| 6,108,309 A | 8/2000 | Cohoe et al. |
| 6,242,873 B1 | 6/2001 | Drozdz et al. |
| 6,405,173 B1 | 6/2002 | Honarvar et al. |
| 6,507,809 B1 | 1/2003 | Yoshino et al. |
| 6,684,192 B2 | 1/2004 | Honarvar et al. |
| 7,020,797 B2 * | 3/2006 | Patil ............... 714/4 |
| 2002/0123832 A1 * | 9/2002 | Gotvall et al. ........ 701/33 |

* cited by examiner

METHODS AND SYSTEMS FOR ADVANCED SPACEPORT INFORMATION MANAGEMENT

PRIORITY CLAIM

This application claims priority from the U.S. Provisional Patent Application No. 60/593,014 entitled "METHODS AND SYSTEMS FOR ADVANCED SPACEPORT INFORMATION MANAGEMENT" filed on Jul. 30, 2004, the contents of which are incorporated herein by this reference.

GOVERNMENT LICENSE RIGHTS

The invention described herein was made in the performance of work under Contract Nos. NAS10-02007 and NAS10-11400 administered by the National Aeronautics and Space Administration, and is subject to the provisions of Section 305 of the National Aeronautics and Space Act of 1958 (72 Stat. 435: 42 U.S.C. 2457). The United States Government has certain rights to this invention.

FIELD OF THE INVENTION

The present disclosure relates to information management systems, and more specifically, to methods and systems for advanced spaceport information management, including, for example, test and verification systems for spaceflight payload testing.

BACKGROUND OF THE INVENTION

It is very important that the operational characteristics of payloads that are to be transported into space aboard launch vehicles be tested and verified prior to launch. For example, the requirement to perform testing of payloads that are intended to be launched aboard the Space Shuttle is founded upon the Space Shuttle Program Directives NSTS 07700 of the National Aeronautics and Space Administration (NASA). The need to test payloads prior to launch is primarily based upon the need to mitigate risk to launch and on-orbit operations.

The testing of high-value, often one-of-a-kind spaceflight hardware has historically remained a source of high cost for the payload developer. In terms of travel and transportation of the developed payload and support personnel to the launch site, testing costs have historically been driven by external factors, including scheduling of tasks, resource availability, and geographic concerns. Additionally, the far-reaching and complex nature of the problems encountered during payload processing at the launch site present substantial challenges to efforts to control costs while at the same time maintaining a high degree of technical quality. Therefore, improved payload testing techniques that at least partially mitigate the cost and complexity of the prior art test and verification methods would be valuable and useful. These issues are increasingly evident in the transition from dedicated hardware processing and launch sites to a Spaceport environment, where payload processing is less a launch site undertaking.

SUMMARY OF THE INVENTION

The present invention is directed to methods and systems for advanced spaceport information management and transitional capabilities thereto. Methods and systems in accordance with the present invention may advantageously relocate test operations that are traditionally performed at the launch site to the payload developer location, thereby reducing the processing time required at the launch site, reducing the dependency upon launch site infrastructure, and reducing costs and promoting a distributed teaming approach to payload test and verification. This allows the evolution from current operational scenarios to the Spaceport operations approach to space access.

In one embodiment, a method for testing a payload includes coupling a test system to the payload and transmitting one or more test signals that emulate an anticipated condition from the test system to the payload. One or more responsive signals are received from the payload into the test system and are analyzed to determine whether one or more of the responsive signals comprises an anomalous signal. At least one of the steps of transmitting, receiving, analyzing and determining includes transmitting at least one of the test signals and the responsive signals via a communications link from a payload processing facility to a remotely located facility. In one particular embodiment, the communications link is an Internet link from a payload processing facility to a remotely located facility (e.g. a launch facility, university, etc.) or accommodated by models found within the remotely configurable test interface.

BRIEF DESCRIPTION OF THE DRAWINGS

The preferred and alternative embodiments of the present invention are described in detail below with reference to the following drawings.

DETAILED DESCRIPTION

The present invention relates to methods and systems for advanced spaceport information management and transitional capabilities thereto. Many specific details of certain embodiments of the invention are set forth in the following description and in FIGS. 1-5 to provide a thorough understanding of such embodiments. One skilled in the art will understand, however, that the present invention may have additional embodiments, or that the present invention may be practiced without several of the details described in the following description.

In brief, embodiments of the present invention take advantage of a distributed teaming concept for the processing of payload test requirements. Emerging networking technology advantageously allows for the capability through assured command and telemetry integrity. By exploiting such a distributed teaming concept, the testing of payload components and subsystems may be accomplished at the location of the payload developer prior to transport of the payload to the launch site. For payloads with components developed in more than one location, integration at a common site will still be required. Furthermore, relocating test operations that are traditionally performed at the launch site to the payload developer location typically results in a reduction in processing time required at the launch site (e.g. Kennedy Space Center), and may also reduced dependency upon launch site infrastructure. In turn, the costs associated with testing traditionally performed at a centralized location, such as the launch site, may be reduced.

Figure 1:
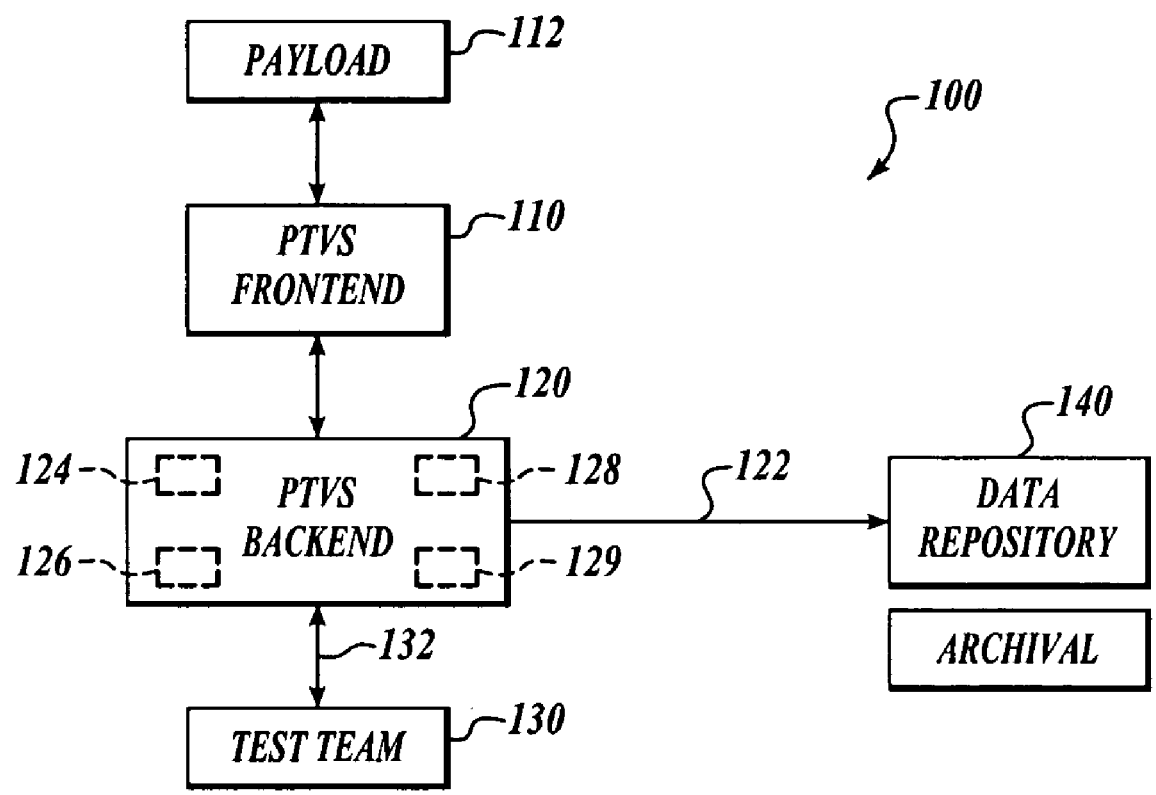
FIG. 1 is a schematic view of a test and verification system in accordance with an embodiment of the invention.

FIG. 1 is a schematic view of a portable test and verification system (PTVS) 100 in accordance with an embodiment of the present invention. In this embodiment, the system 100 includes a front end 110 that is adapted to communicate with a payload 112, and a back end 120 that is adapted to communicate with the front end 110 and with a payload test team 130. The payload test team 130 may be remotely located, and may communicate with the back end 120 via a communication link 132 (e.g. a global computer communication network, a wireless link, etc.). The back end 120 may be further adapted to communicate with a payload data repository 140.

In an alternate embodiment, the back end 120 may be co-located with the payload test team 130 at a remote location, and may communicate with the front end 110 co-located with the payload 112 at a payload test facility via a communication link 132. In yet another embodiment, the back end 120 and the front end 110 may be co-located with the payload test team 130 at a remote location, and may communicate with the payload 112 at a payload test facility via a communication link 132. In further embodiments, the payload data repository 140 may be co-located with any of the payload test team 130, the back end 120, the front end 110, and the payload 112, or may be located at an entirely different remote facility and may communicate via a second communication link.

The system 100 may be a portable payload checkout unit with a domain architecture that allows configuration and deployment for use on multiple payloads at diverse payload developer sites, and may easily accept upgrades and expansions. In this embodiment, the system 100 is characterized as a basic functioning system to support a generic test environment that is reconfigured to variations tailored to the needs of the payload interfaces and scope of the risk to be mitigated. The system 100 may be shipped via commercial carriers and may retain realistic launch vehicle interfaces and capacity to store data, as well as control and monitor ground support equipment. As described more fully below, the system 100 may provide for a distributed team approach utilizing computer communication network (e.g. Internet) applications and protocols.

In one embodiment, the system 100 may be highly automated with self-checking and monitoring capabilities to ensure minimal user interaction requirements. These checks, for example, may include provisions for disk drive and data storage media monitoring to notify the user prior to the manifestation of an anomaly. Such notifications may be based upon current system status coupled with resident trend data to predict potential problems. Corrective action to correct potential problems may involve activation of pre-programmed operations, or manual intervention by a user or system administrator, to rectify the error condition. Additional automation features may include, for example, the tracking of user files to allow purging of these files at pre-determined periods.

Additionally, the networking of test team members from differing locations via secure Internet connectivity may advantageously support a broad exposure to the testing operation, thereby fostering a synergy and ideas in the event of an anomalous condition. Tests again joining may become more effective through the use of the distributed team approach by reducing the need for the travel of team members to the test site.

A system management feature 124 of system 100 may be focused upon the changing requirements of the system. In the embodiment shown in FIG. 1, the system management feature 124 is integrated into the back end 120. As system requirements change, the hardware and software may be configured per the system requirements followed by a pre-shipment test to ensure operability. The distributed nature of the system 100 may allow real-time services to be administered from the launch site or alternate location as the need arises. These services may include providing remote assistance for troubleshooting efforts required for either the system 100 or the payload 112 under test. Remote support capability and disaster recovery of the system 100 may be facilitated through the employment of appropriate technical strategies implemented prior to shipment to the payload developer location. Additionally, real-time monitoring of payload elements may also be performed remotely on the system 100 through coordination with the payload developer. Monitor and command capabilities of the system 100 from the launch site may also be incorporated into the system designed to facilitate fault isolation and remediation of test system related anomalies. A common engineering database (e.g. the data repository 140) may be created and stored for distributed access to support commanding and test parameter storage. In addition, test data may be available in a real-time format to those team members with the appropriate permissions.

The system 100 may advantageously provide improved capability for testing at a payload development facility rather than at a final launch facility. As the payload 112 progresses from the early stages of development through integrated testing, the interface, command, and measurement definitions performed by the system 100 may evolve. For example, initially the definition may be applied to the interface directly at the payload 112, whereas in integrated testing the definition could include spacecraft or payload routing and structure that is stripped off or added by systems communicating with the payload 112. In a representative embodiment, the design of the system 100 is centered on a small, portable test solution that is readily accommodated by general office type of support, such as standard power and indications. Management of interfaces may be accomplished through the use of remote commanding or on-board simulation and modeling accommodations.

In the embodiment shown in FIG. 1, user notifications for the completion of major test activities where the identification of parameters that are beyond established specifications may be accomplished by the back end 120. During periods of component testing by the payload developer, the Internet connectivity may not be required and therefore may be accomplished without network connection 122. In this instance, any conformance report data normally replicated to the data repository 140 via the network connection 122 or may be archived locally for download to the appropriate repository 140 at the next connection opportunity.

The system 100 may take full advantage of portability and maintenance attributes through the minimization of hardware requiring continual maintenance and calibration, while maximizing software asset properties of configure ability and flexibility. Efficient system maintenance and repair may be afforded through the integration of automated fault trees and diagnostics, as well as interleaved and built-in-test equipment for the system 100 and for nominal characterization, troubleshooting, and remediation. Remote operation and troubleshooting capabilities for the system 100 may exist through remote system safety and isolation, troubleshooting, and maintenance commanding. Self-test, system safety, and troubleshooting capabilities are founded upon the concept of a configuration independent architecture, thereby eliminating the need to disconnect from a flight element under test in order to assure system confidence. Development of flight system command sets are facilitated by the on-board test system software and database configuration management capability.

As further shown in FIG. 1, a software wizard 126 may be an integral part of a total test configuration, and may act as a tool for planning and instituting specific test configurations of the system 100. The software wizard 126 may accommodate the payload developer in identification of test configuration requirements, the posting of testing event milestones, and the generation of schedules and reports (i.e. status of requirement satisfaction, system configuration, problem reporting trend analysis, etc.) needed to coordinate integrated launch site activities prior to need.

The system 100 further includes an onboard scripting and procedural development capability 128. The interactivity between the scripting and procedural development capability 128 and the test schedule, generated as a result of the initial interview conducted by the software wizard 126, provides for comprehensive view of planned testing and major payload processing operations. In addition, the scripting and procedural development capability 128 may include the ability to annunciate anomalous conditions, initiate the documentation of those conditions, render a method of constraining further testing if not technically feasible or unsafe, and support troubleshooting of the malfunction.

Control and monitoring of the system 100 may be performed through a main screen graphics user interface (GUI) display 129. This display 129 may offer quick assessment of all health and status characteristics of the system 100 by means of, for example, color-coded display graphics (e.g. green for nominal operations, yellow for condition requiring immediate attention, and red for anomalous conditions).

Figure 2:
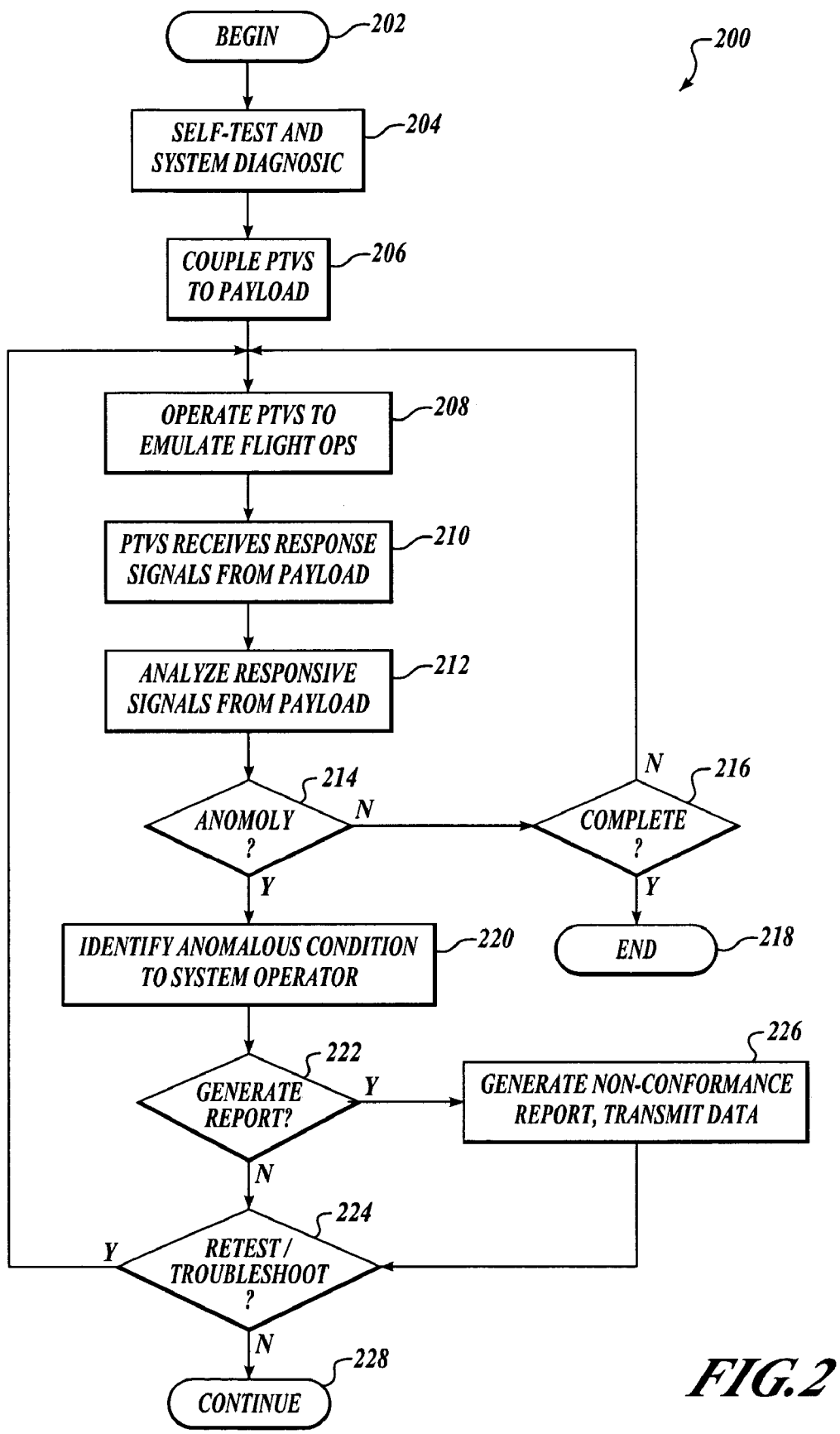
FIG. 2 is a method of test and verification of a payload under test in accordance with an embodiment of the invention.

FIG. 2 is a method 200 of test and verification of a payload under test 112 in accordance with an embodiment of the invention. The method 200 begins at a block 202. Prior to interface of the system 100 (FIG. 1) with spaceflight hardware (e.g. the payload under test 112 or a launch vehicle), a full self-test and system diagnostic may be performed at a block 204 to ensure the operator's confidence in the ability of the system 100 to safely and efficiently perform the desired test operation. Such a self-test may also accomplish the verification of connectivity interface configuration and response to input modeling, and may assure the proper configuration and operation of appropriate security devices (i.e. encryption accommodations, intrusion detection, system monitoring, etc.) of the system 100 to launch site networking assets (e.g. the test team 130) for distributed teaming operations.

In this embodiment, the method 200 further includes operatively coupling the system 100 to the payload under test 112 at a block 206. At a block 208, the test and verification system 100 transmits one or more signals to the payload under test 112 to emulate conditions that the payload under test 112 may be expected to experience during flight operations. The signals transmitted by the system 100 to the payload 112 may include, for example, command signals that activate certain systems or actions to be performed by the payload 112, and test data signals that the payload 112 may be expected to receive, analyze, and interpret during flight operations. The test and verification system 100 then receives one or more responsive signals from the payload under test 112 at a block 210, and analyzes the responsive signals from the payload 112 at a block 212.

At a block 214, a determination is made regarding whether a responsive signal represents an anomalous condition. If not, then at a block 216, the method 200 determines whether test and verification of the system 100 is complete. If not, then the method 200 returns to the emulation of flight operations at block 208. If test and verification is determined to be complete, then the method 200 terminates at a block 218.

As further shown in FIG. 2, if the method 200 determines that the responsive signal represents an anomalous condition at the block 214, then at a block 220, the occurrence of the anomalous condition is identified to the system operator via display accommodations. Upon the discovery of the test parameter that is out of tolerance with the procedural input, at a block 222, a dialog box may be displayed on the system display that queries if the user would like to generate a nonconformance report.

If the dialog box (block 222) is answered "yes", then at a block 226, a nonconformance report is generated and the malfunction is logged flagging any procedural (and operational) constraints, the test module and step where the constraint applies, whether re-test of the affected module is necessary, and finally, transmits nonconformance to the payload data center 140 while maintaining a copy on board. The copy in the payload data center 140 may be accessible by launch site personnel for resolution, if required, and to the payload developer personnel through the back end 120.

If the answer is "no", then at a box 224, a second box will inquire as to whether the user wishes to retest the condition, troubleshoot (terminating the test script at that point and manually providing parameters and rejoin the test script at the next major test module), or exit the script thereby terminating the system testing script. If the user wishes to retest the condition, then the method 200 returns to block 208 to allow retesting to be performed. Alternately, if no retesting is desired, the method 200 proceeds to a block 228 to continue or to terminate.

In alternate embodiments, retest capabilities of an anomalous condition may be provided via display and software interaction relating to the malfunctioning feature. Maintenance logs may be resident within the system 100, as well as within the payload data center 140, to assure it easy access by authorized system troubleshooters. The efficient troubleshooting and repair of anomalies related to remotely assigned system 100 may be assisted through the employment of a help desk activity that resides at the launch site.

Embodiments of methods in accordance with the present invention advantageously improve the distributed teaming approach to the test and verification of payloads. Specifically, at least one of the transmitting one or more test signals, receiving one or more responsive signals, analyzing one or more responsive signals, and determining whether one or more of the responsive signals comprises an anomalous signal involves transmitting at least one of the test signals and the responsive signals via a communications link from a payload processing facility to a remotely located facility. This advantageously allows personnel from various facilities (e.g. a payload processing facilities, launch site facilities, universities, governmental facilities, etc.) to be involved in the test and verification procedure via a communication link (e.g. an Internet link) between different cities, different states, and different countries.

A computer program that embodies a method of testing and verifying payload operational capability (e.g. the method 200 shown in FIG. 2) may be stored on a computer-readable medium that may be uploaded into the memory of the hardware system and may be used to test and verify the performance of the payload.

Figure 3:
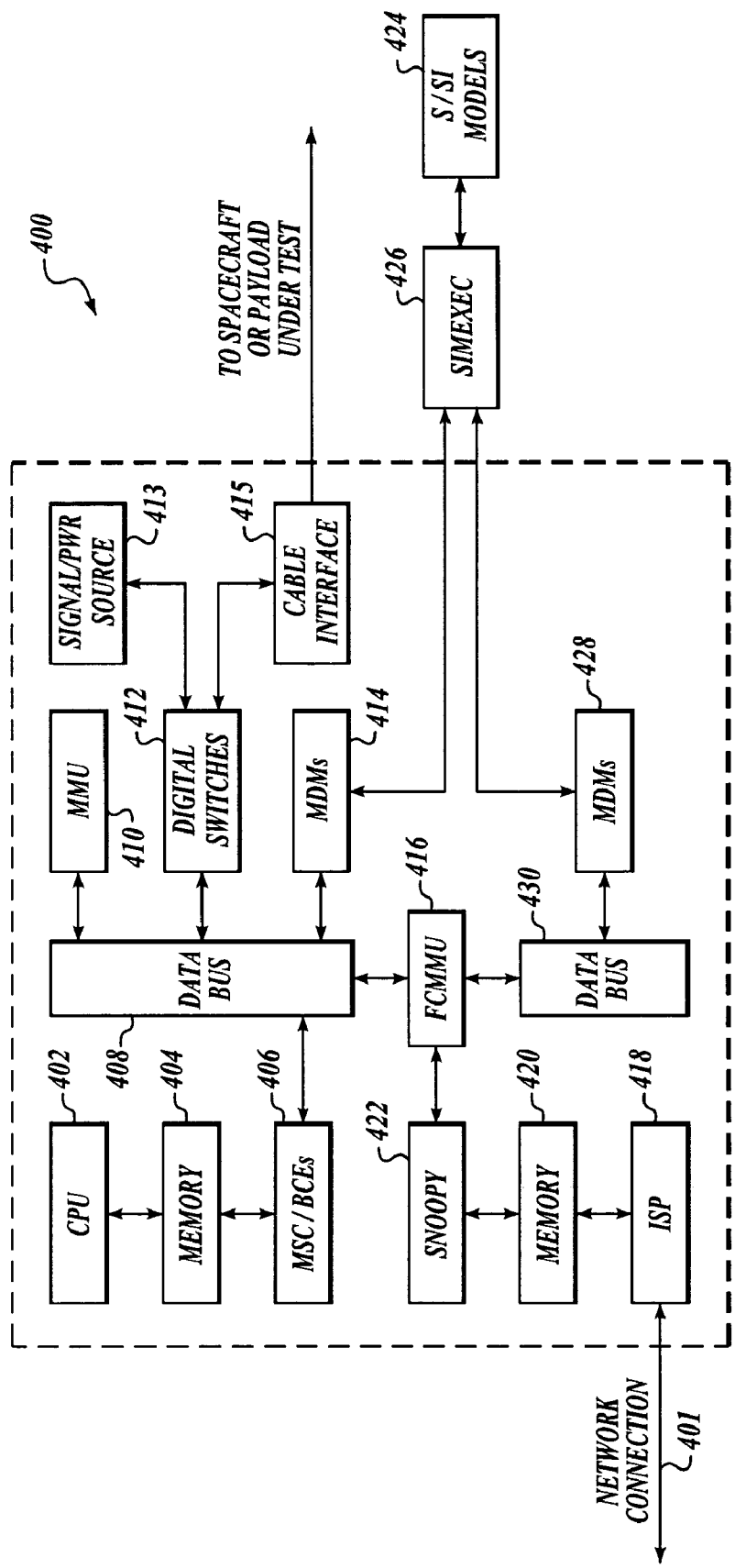
FIG. 3 is a schematic view of a set of software components of a hardware (i.e. remotely configurable test interface) system in accordance with another embodiment of the invention.

More specifically, FIG. 3 is a schematic view of a set of software components 400 of a hardware system in accordance with another embodiment of the invention. As shown in FIG. 3, a CPU 402 of the Payload Model Development computer is coupled to a memory 404 which, in turn, is coupled to a Message Sequence Chart 406. The Message Sequence Chart 406 transmits data to and receives data from a data bus 408. Similarly, a Memory Management Unit (MMU) 410, a digital switching array 412, a first Multiplexer/Demultiplexer (MDM) module 414, and a Personal Computer Memory Management Unit (PCMMU) 416 are also coupled to the data bus 408. A signal and power source 413 is connected via digital switching array 412 to the cable interface 414 to the flight system under test.

An Information Sharing Protocol (ISP) server 418 is coupled to a memory 420 which, in turn, is coupled to a communications program (nicknamed "Snoopy") 422. The ISP server 418 distributes telemetry and computer data to remote users (not shown). The communications program 422 gathers telemetry information from the PCMMU 416 and makes it available to the user applications through the ISP server 418.

With continued reference to FIG. 3, a set of test simulation models 424 (e.g. System/Simulation Infrastructure (S/SI) managed models) is coupled to the SIMEXEC 426. The SIMEXEC 426 communicates with the data bus 408 via the first MDM module 414. A second MDM module 428 is coupled between the SIMEXEC 426 and a second data bus 430 which, in turn, is coupled to the PCMMU 416.

In operation, the test simulation payload models 424 may reside on a model/command development computer and may allow a user to verify and validate the operation of the item under test, and may be used to test the interface between ancillary test equipment and the system under test. Payload data may be placed in the SIMEXEC 426 on, for example, Scramnet Reflective Memory, which may advantageously allow data communication between the mission simulation payload models 424 and the other elements of the system via a shared memory interface. The SIMEXEC 426 provides the seamless management of models and the formulation of digital switch configurations to provide the needed test input to the payload or system under test. This may be in response to scripted input, manually input test parameters, or operational model. Models resident in the System/Simulation Infrastructure (S/SI) model environment 424 are established prior to the attachment of the test system to the payload or system under test to prevent the introduction of spurious, erroneous signals or voltages into the test article. This is accomplished via CPU 402 or network connection 401.

Figure 4A:
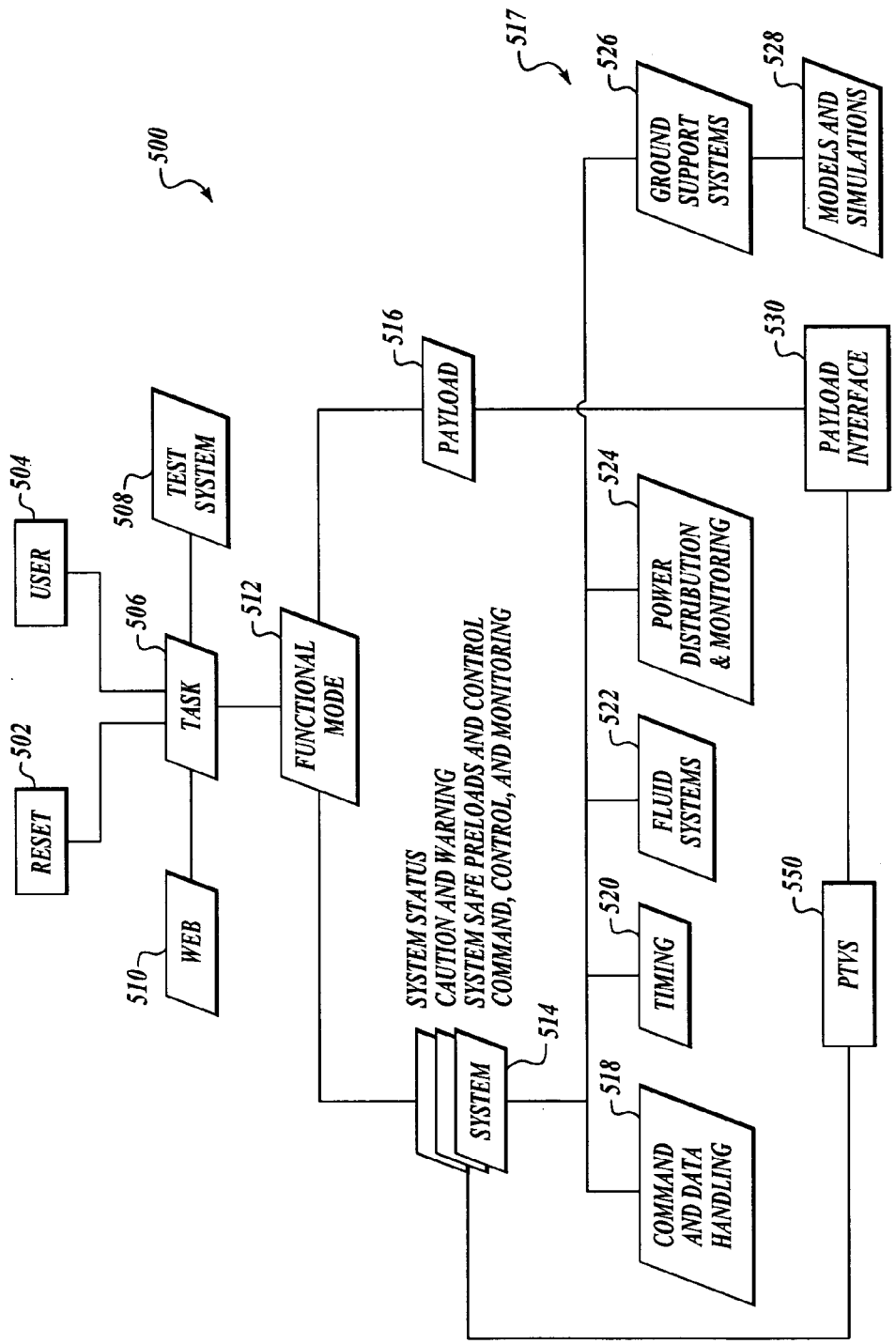
FIG. 4A is a schematic view of an avionics software tasking model in accordance with another embodiment of the invention.

FIG. 4A is a schematic view of an avionics software tasking model 500 in accordance with a further embodiment of the invention. In this embodiment, the avionics software tasking model 500 includes a reset capability 502 for initialization of a payload under test. A user 504 may initiate an avionics software task 506 that may use information supplied from a local computing system 508 and from a remote via a communication link (e.g. a Web) 510. A functional mode module 512 then receives input from the task 506 and transmits appropriate command signals to a system 514 and to a payload 516. In turn, the system 514 transmits appropriate commands to one or more components of a driver layer 517. In this embodiment, the hardware driver layer 517 includes a command and data handling module 518, a timing module 520, a fluid systems module 522, a power distribution and monitoring module 524, and a ground support system module 526. A models and simulations module 528 is coupled to the ground support system module 526, and a payload interface module 530 is coupled to the payload 516. Finally, a payload test and verification system 550 is coupled to the system module 514.

In operation, the PTVS 550 is capable of being commanded/monitored via the Web 510 (i.e. Internet) interface or other test routines/simulations found on the system module 514 (e.g. previously loaded from the Internet access or via other portable storage media, including CD-Rom, USB or equivalent Memory Stick, Deployable hard drives, etc.). Software functional modes include a System level (indicating the PTVS) functions and a Payload function. In alternate embodiments, the payload module 516 functionality may be replaced by functionality for any space vehicle or payload while maintaining the overall PTVS capabilities. Only vehicle specific simulations, test scripts, or test parameters must be loaded to assure compatibility.

The system module 514 functionality may provide the System Status (operating parameters of the PTVS 550 and associated equipment), Caution and Warning (associated with Test System maladies and certain warnings/interlocks regarding Payload/Vehicle and Test System interoperability), System Safe Pre-Loads (software configured to position systems in a safe posture in the event of detected malfunction of a critical test capability or vehicle/payload system), and the overall command, control, and monitoring of the payload/vehicle under test as well as the PTVS internal capability. Software capabilities which are subordinate to the system module 514 function include the management of Command and Data Handling, the distribution and management of Timing issues, control and measurements associated with fluid systems under test, the control, distribution and monitoring of Power to the Test System (PTVS) and systems under test, and finally, the command, control and monitoring of ground systems used during the test activity (i.e. pumps, meters, fluid support, data networking, formulation and application of simulations and models with a real-time management capability, data recording and processing, etc.).

Figure 4B:
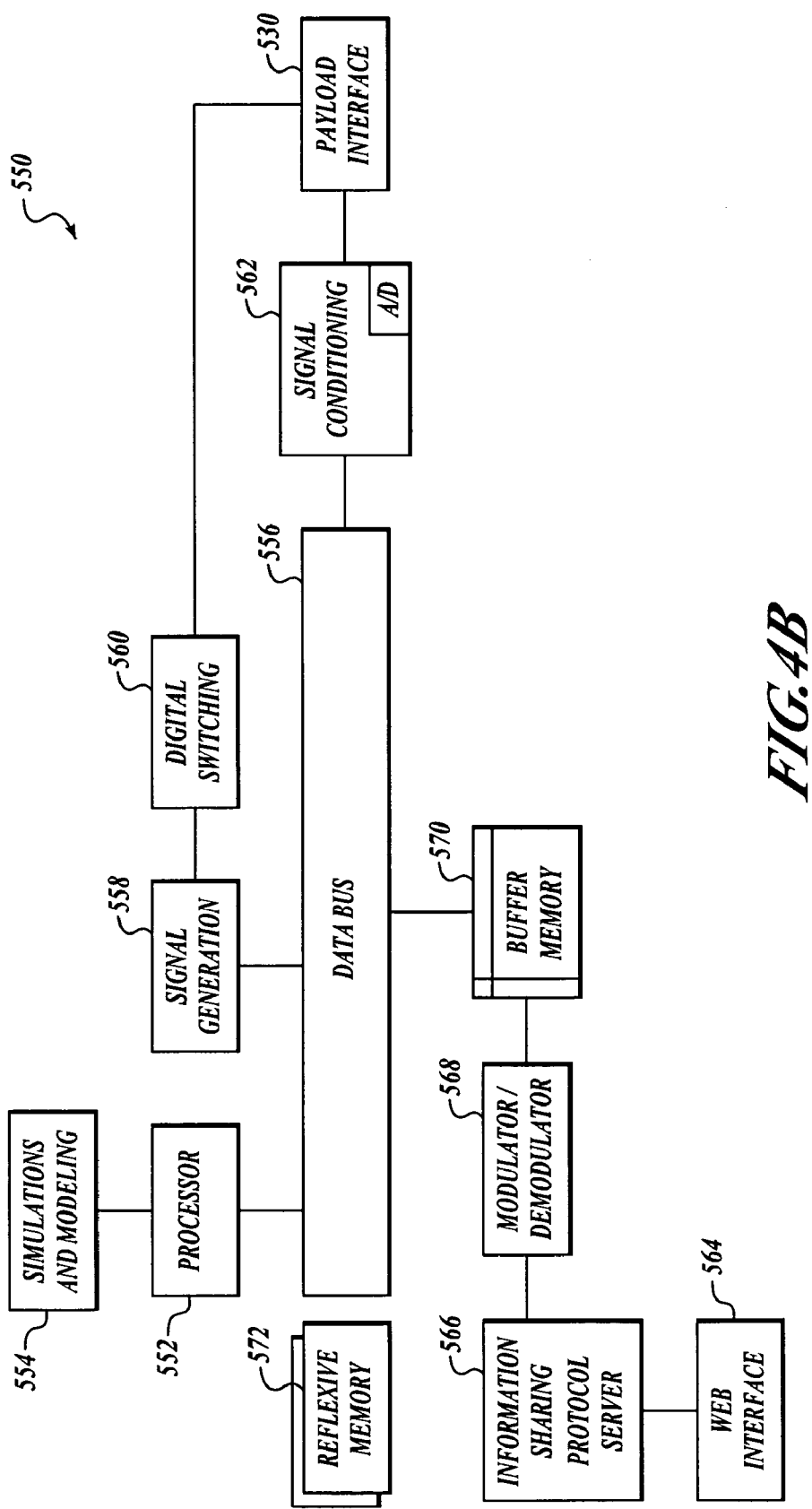
FIG. 4B is a schematic view of a test and verification system in accordance with yet another embodiment of the invention.

FIG. 4B is a schematic view of the portable test and verification system 550 of FIG. 4A. In this embodiment, the PTVS 550 includes a processor 552 operatively coupled to a simulations and modeling module 554 and to a data bus 556. A signal generation module 558 is coupled to the data bus 556 and to a digital switching module 560 which, in turn, is coupled to the payload interface 530 (FIG. 4A). A signal conditioning module 562 is also coupled between the data bus 556 and the payload interface 530.

The PTVS 550 further includes a web interface 564 that received inputs from, and transmits outputs to, a remote location. These data are passed through an information sharing protocol server 566, a modulator/demodulator 568, and a buffer memory 570 en route to the data bus 556. Finally, a reflective memory 572 (e.g. a scramnet reflective memory) is coupled to the data bus 556.

In operation, the PTVS 550 provides a test capability which bridges the gap between the testing of payloads/vehicle institutionally and testing at an advanced spaceport where systems are tested by vehicle and/or payload developers with the use of spaceport assets relegated to networking systems, common fluid commodities, ground power, data routing, mechanical positioning systems, and the command, control, and monitoring of the mission. With this in mind, the PTVS 550 is capable of supporting command and control via the Internet interface or internal simulations/models for a payload or vehicle.

Command, control, and monitoring of the system under test (payload or vehicle) may be accomplished via the web interface 564 through association with the information sharing protocol server 566 (e.g. using an ISP software load). Upon the demodulation of incoming commands using the modulator/demodulator 568, the buffer memory 570 acts to preclude command timing issues between the test environment and the external command capability. Application of a command of external origin to the data bus 556 allows the storage of the command in the reflective memory 572 while the same command is examined by the processor 552 and the actions associated with the incoming command are executed. In the event the command requires translation into the payload for an immediate response, the on-board models/simulations contained in the simulations and modeling module 554 are available which correspond to the necessary actions and will trigger the appropriate signal generation from the signal generation module 558, and gated application using the digital switching module 560. Analog or digital responses from the payload/vehicle are accommodated by the signal conditioning capability of the signal conditioning module 562 which then routes the digital data to the reflective memory 572 until requested by the processor 552 for use or downloading via the web interface 564.

It will be appreciated that a primary innovation of the embodiments shown in FIGS. 4A and 4B is that the payload and vehicle testing community is enabled to evolve from an institutional testing capability of specialized hardware and software to a capability more akin to a commercial airport operation where vehicle owners provide for the testing and care of mission hardware/software with private resources. Thus, only general support needs to be provided by the launch/landing site(s).

Figure 5:
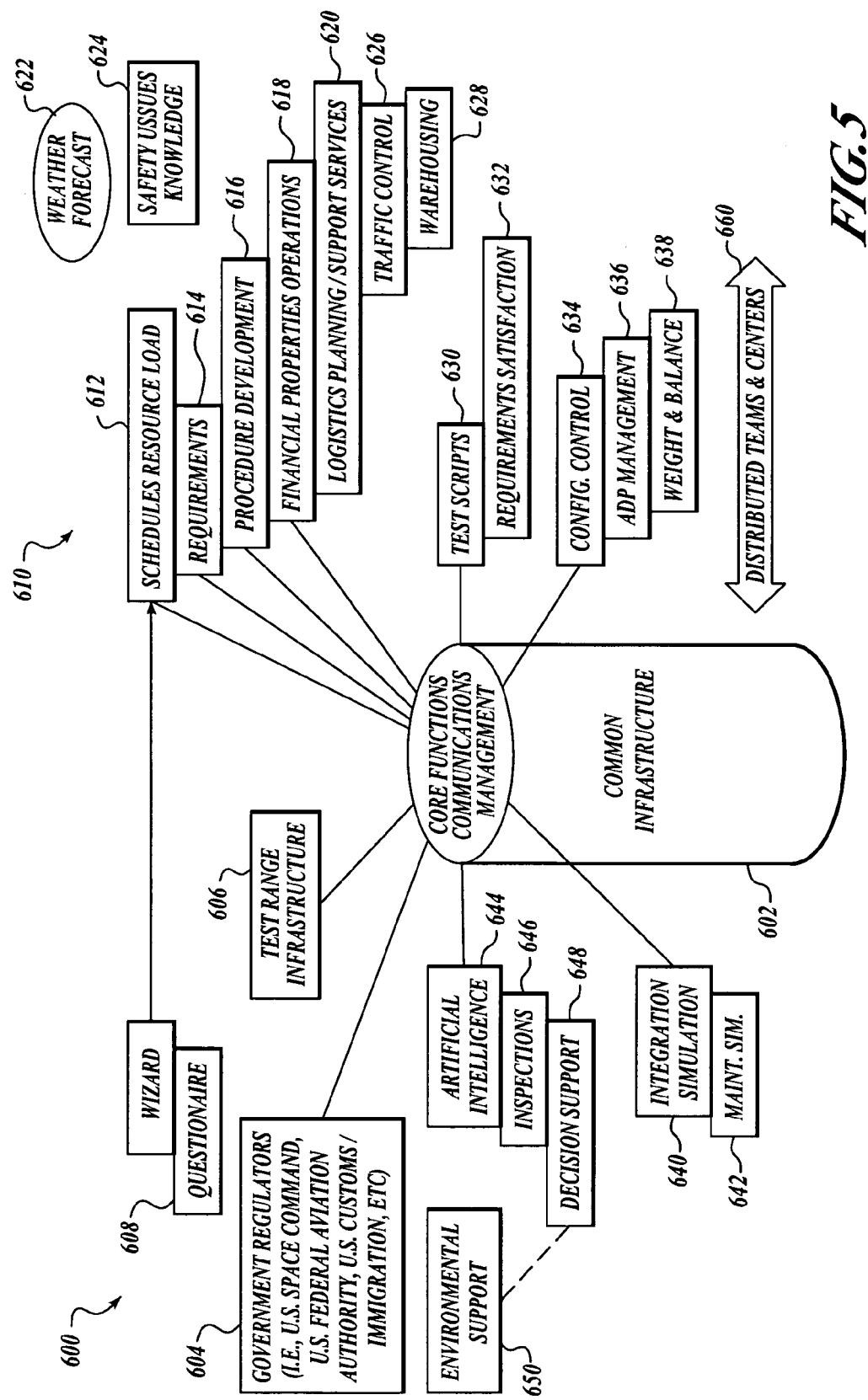
FIG. 5 is a schematic view of an integrated spaceport automated data management architecture in accordance with another alternate embodiment of the invention.

FIG. 5 is an integrated spaceport automated data management architecture 600 in accordance with another alternate embodiment of the invention. In this embodiment, the architecture 600 includes a common infrastructure 602 for the performance of core functions, including, for example, communications and management activities. A plurality of wizard-driven, highly-integrated and distributed modules interface with the common infrastructure 602 to enable inter- and intra-center indications in system operation management. In one particular embodiment, the modules interface to the common infrastructure 602 using computer software (or middleware) that allows the seamless introduction and removal of various functional elements or modules during systems integration, security, and maintenance operations. One example of the middleware that may be used for this purpose is the System/Simulation Infrastructure (S/SI) software developed by The Boeing Company of Chicago, Ill. As described more fully below, the architecture 600 advantageously allows for scalability and system modifiability.

As shown in FIG. 5, the plurality of modules coupled to the common infrastructure 602 includes a government regulators module 604, a test range module 606, and an input module 608. The input module 608 is operatively coupled to a set of planning modules 610 that includes a scheduling module 612, a requirement module 614, a procedure development module 616, a financial properties module 618 and a logistics planning modules 620. Supporting information provided to the planning modules 610 includes weather forecasting information 622 (e.g. winds, sheer warnings, direction, speed, precipitation, lightning, whether system impacts, etc.), safety issues information 624, traffic control information 626, and warehousing information 628.

A test script generation module 630 is also coupled to the common infrastructure 602. The test script generation module 630 receives requirements satisfaction information 632, and generates test scripts accordingly. The test scripts may allow automated testing, or testing with human intervention as a priority (e.g. safety, quality checkpoints, etc.), and real-time data reduction. A configuration control module 634 is coupled to the common infrastructure 602 and provides automated acceptance data package management 636, automated weight balance calculations 638, and may generate flight certification information (not shown).

An integration simulator module 640 is coupled to the common infrastructure 602 and utilizes maintenance simulation information 642. The integration simulator module 640 may include, for example, automated cell-verifying interface simulations, maintenance simulations, integration simulations, operation simulations, robotics, and any other suitable simulations. Support for multiple types of spacecraft or payloads are accommodated through the employment of modeled input from the simulation module. Additionally, the combination of Artificial Intelligence 644, Inspections 646, and Decision Support module 648 parameters with the Integration Simulation 640 and Maintenance Simulation 642 provide the basis for support of state-of-the-art vehicle and payload testing using non-invasive technologies (i.e. radio frequency resonance, quantum resonance, magnetic resonance, etc.).

An artificial intelligence module 644 is also coupled to the common infrastructure 602, and utilizes inspection information 646, decision-support information 648, and environmental support information 650. The artificial intelligence module 644 may perform artificial vision functions (e.g. for inspections and validations), decision-support functions, and other suitable functions.

The common infrastructure 602 is coupled by a communications link 660 to one or more distributed teams, centers, payload processing facilities, vehicle processing facilities, or other interested parties involved in the payload integration process. This link allows for the on-runway or launch pad location access of the vehicle or payload to diagnostic information from the equipment operator. This is provided from transmission points embedded strategically near and at the points of convergence of the vehicle to the launch point. These access points accommodate the vehicle or payload owners access to equipment without Spaceport mediation.

Embodiments of integrated spaceport automated data management architecture 600 in accordance with the present invention may provide significant advantages over the prior art. For example, architectures in accordance with the present invention may render fully-integrated functionality to support the implementation of advanced spaceport launch facilities, without presupposing any specific launch vehicle or type of vehicle (vertical or horizontal operations). The architecture 600 encompasses all major data resources required to support the ground operations of an operational spaceport for commercial or governmental used. Furthermore, architectures in accordance with the present invention suppose any spaceport as a no-load on a national (or global depending upon the implementation) domain. Therefore, the capacity to plug the spaceport into the major network or withdraw as operational conditions arise in the seamless manner is also supposed in the architecture.

A payload lifecycle 700 in accordance with yet another embodiment of the invention will now be described. In this embodiment, the lifecycle 700 includes preflight operations 702. The preflight operations 702 may include those preflight operations associated with the preparation of a payload 704 as well as those associated with a launch vehicle 706. More specifically, the preflight operations 702 may include the performance of payload test and verification activities using one or more embodiments of apparatus and methods in accordance with the present invention, including those embodiments described above with reference to FIGS. 1-5.

In a presently preferred embodiment, the lifecycle 700 also includes flight system integration activities 708, including the integration of the payload within the launch vehicle. Servicing and departure activities 710 are also performed. A desired mission 712 (e.g. a spaceflight) is then performed using the payload and the launch vehicle. The lifecycle 700 also includes landing and recovery activities 714 and turnaround preparations 716. Following the turnaround preparations 716, alternatives include providing deliverables to a payload customer 718 (e.g. test data, information, hardware, specimens, etc.), returning the launch vehicle to preflight operations 720, and returning the payload to preflight operations 722.

It will be appreciated that embodiments of methods and systems for information management in accordance with the present invention are applicable to a spaceport application supporting multiple types of spacecraft and payload configurations. Embodiments of the present invention are capable of enabling the testing of payload elements in an autonomous fashion under direct and indirect control of the payload developer. Thus, the testing of individual payloads may be transitioned to the payload developer and undertaken during space delivery system pre-flight operations through an autonomous communications link under the payload developer's control. Consequently, mission operations may be provided by the payload developer autonomously via the communications link, software, or artificially derived knowledge. As used herein, the term artificially derived knowledge includes knowledge which is attained as a result of the implementation of rules, interpolation of naturally or artificially occurring data, or derived from sensory input manipulation (e.g. knowledge output from an artificial intelligence engine or experiences of a sensory device).

Embodiments of payload lifecycles in accordance with the present invention may provide significant advantages over the prior art. For example, because the preflight operations involving the payload 704 may utilize apparatus and methods of test and verification of the payload in accordance with the present invention, the overall payload lifecycle may be improved. More specifically, embodiments of the present invention provide Web-accessible data retrieval systems that utilizes semantic data relationship to render search and retrieval of multisensor data residing on a single or multiple databases.

Embodiments of the present invention may also enable the use of a common set of processes and tools for increased cost savings through significantly increased synergy across payload life cycle activities (such as development, test and certification, on orbit operations, and post-mission data reduction and analysis) and organizations. This is accomplished through the implementation of a reusable payload checkout system framework with a flexible and well-integrated suite of services. The framework will permit the services to be deployed in remotely distributed geographic locations for use by payloads stakeholders alone, in local communities, or together as collaborative teams.

Payload lifecycle activities are currently performed by a number of loosely integrated and, at times, disjoint "fiefdoms". Many organization-unique processes and tools are used to support similar capabilities and the very same program data products, like the command and measurement tables, are often reengineered by each organization for compatibility with their system. Embodiments of apparatus and methods in accordance with the present invention, however, will permit the entire payloads community to standardize and use tailor-able, mature processes that embody the current best practices of payload processing.

While preferred and alternate embodiments of the invention have been illustrated and described, as noted above, many changes can be made without departing from the spirit and scope of the invention. Accordingly, the scope of the invention is not limited by the disclosure of the preferred and alternate embodiments. Instead, the invention should be determined entirely by reference to the claims that follow.

What is claimed is:

1. A payload life cycle apparatus, comprising:
 a preflight operations portion that includes a payload test procedure, the payload test procedure including:
  transmitting one or more test signals that emulate an anticipated condition from a test system to the payload;
  receiving one or more responsive signals from the payload into the test system;
  analyzing one or more responsive signals; and
  determining whether one or more of the responsive signals comprises an anomalous signal,
  wherein at least one of the transmitting, receiving, analyzing, and determining comprises communicating via a communications link from a payload processing facility to a remotely located facility;
 a flight system integration portion that includes integration of the payload within a launch vehicle; and
 a desired mission portion.

2. The payload life cycle of claim 1, wherein the payload test procedure is further adapted to communicate via an Internet link from a payload processing facility to a remotely located facility.

3. The payload life cycle of claim 1, wherein the payload test procedure is further adapted to communicate via a communications link from a payload processing facility to a launch facility.

4. The payload life cycle of claim 1, wherein the payload test procedure is further adapted to communicate via a communications link from at least one of a first city to a second city, a first state to a second state, and a first country to a second country.

5. The payload life cycle of claim 1, wherein the payload test procedure is further adapted to at least one of identify an occurrence of an anomalous condition to a system operator via a display, query a system operator whether to generate a nonconformance report, transmit a nonconformance report to a remotely located data storage facility, query a system operator whether to retest a nonconforming condition, and troubleshoot a nonconforming condition via the communication link between the payload processing facility to the remotely located facility.

6. The payload life cycle of claim 1, wherein the preflight operations portion further includes a preparation procedure associated with a launch vehicle.

7. The payload life cycle of claim 1, further comprising a servicing and departure portion.

8. The payload life cycle of claim 1, further comprising at least one of a landing and recovery portion, a turnaround preparations portion, and a providing deliverables to a payload customer portion.

9. The payload life cycle of claim 1, wherein the preflight operations portion includes a spaceport application having a plurality of preflight subportions, each preflight subportion supporting at least one of a plurality of spacecraft configurations and a plurality of payload configurations.

10. The payload life cycle of claim 1, wherein the payload test procedure includes testing of at least one payload element autonomously by a payload developer at the remotely located facility via the communications link.

11. The payload life cycle of claim 1, wherein the payload test procedure includes transitioning of an individual payload test procedure to a payload developer at the remotely located facility via an autonomous communications link controlled by the payload developer.

12. The payload life cycle of claim 1, wherein the desired mission portion includes autonomously providing at least one mission operation from the payload integrated with the launch vehicle by the payload developer via at least one of a mission communications link, a software portion, and an artificially derived knowledge.

* * * * *